(12) United States Patent
Higashida et al.

(10) Patent No.: US 7,084,512 B2
(45) Date of Patent: Aug. 1, 2006

(54) CIRCUIT SUBSTRATE AND ITS MANUFACTURING METHOD

(75) Inventors: Takaaki Higashida, Kadoma (JP); Takafumi Okuma, Hirakata (JP); Daisuke Suetsugu, Uji (JP); Seiji Nakashima, Okasa (JP); Kenichi Yamamoto, Moriguchi (JP); Munekazu Nishihara, Neyagawa (JP); Kenichi Sato, Ikoma (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 0 days.

(21) Appl. No.: 10/300,028

(22) Filed: Nov. 20, 2002

(65) Prior Publication Data

US 2003/0094697 A1    May 22, 2003

(30) Foreign Application Priority Data

Nov. 21, 2001 (JP) ............................. 2001-355415
Jan. 29, 2002 (JP) ............................. 2002-019947
Mar. 26, 2002 (JP) ............................. 2002-086373

(51) Int. Cl.
*H01L 23/48* (2006.01)
*H01L 23/52* (2006.01)
*H01L 29/40* (2006.01)

(52) U.S. Cl. ..................... 257/777; 257/678; 257/723
(58) Field of Classification Search ................ 257/777, 257/668, 678, 713, 718, 719, 720, 723, 778
See application file for complete search history.

(56) References Cited

U.S. PATENT DOCUMENTS

| | | | | |
|---|---|---|---|---|
| 4,604,303 | A | * 8/1986 | Takakura et al. | 427/229 |
| 5,004,649 | A | 4/1991 | Yamasaki et al. | |
| 5,463,229 | A | * 10/1995 | Takase et al. | 257/59 |
| 5,637,907 | A | * 6/1997 | Leedy | 257/434 |
| 5,654,220 | A | * 8/1997 | Leedy | 438/25 |
| 5,731,633 | A | * 3/1998 | Clayton | 257/723 |
| 5,731,663 | A | * 3/1998 | Davis | 315/194 |
| 6,232,659 | B1 | * 5/2001 | Clayton | 257/724 |

FOREIGN PATENT DOCUMENTS

| | | |
|---|---|---|
| CN | 2115573 | 9/1992 |
| CN | 1101603 | 4/1995 |
| JP | 01-205495 | 8/1989 |
| JP | 4-82292 | 3/1992 |
| JP | 5-258830 | 10/1993 |
| JP | 11-8457 | 1/1999 |
| JP | 11-74630 | 3/1999 |

\* cited by examiner

*Primary Examiner*—David Nhu (74) *Attorney, Agent, or Firm*—Wenderoth, Lind & Ponack, L.L.P.

(57) ABSTRACT

A circuit substrate has a flexible thin film, electric wires supported on the film, and an electronic component supported on the film and positioned between the wires so that the wires and the component are electrically connected serially. Also, a thickness of the component is less than that of the electric wires.

9 Claims, 11 Drawing Sheets

CIRCUIT SUBSTRATE AND ITS MANUFACTURING METHOD

FIELD OF THE INVENTION

The present invention relates to an electrical circuit substrate. Also, the present invention relates to a film-like electrical circuit substrate, e.g., a thinned integrated circuit substrate, for use with an electronic device or an optical device, including a multi-layered electrical circuit and functional modules mounted on the circuit. Further, the present invention relates to an electrical circuit substrate with a plurality of layered circuit modules each having flexible circuit boards and connections integrally formed with the boards for connecting the boards.

BACKGROUND OF THE INVENTION

Small sized electronic circuits with high performance have been developed so far. In particular, a multi-functional electronic circuit capable of being mounted in a small space has been provided for cellular phones and computers, for example. Simultaneously, further improvements have been made for effective heat radiation from circuits and for downsizing thereof.

Figure 5:
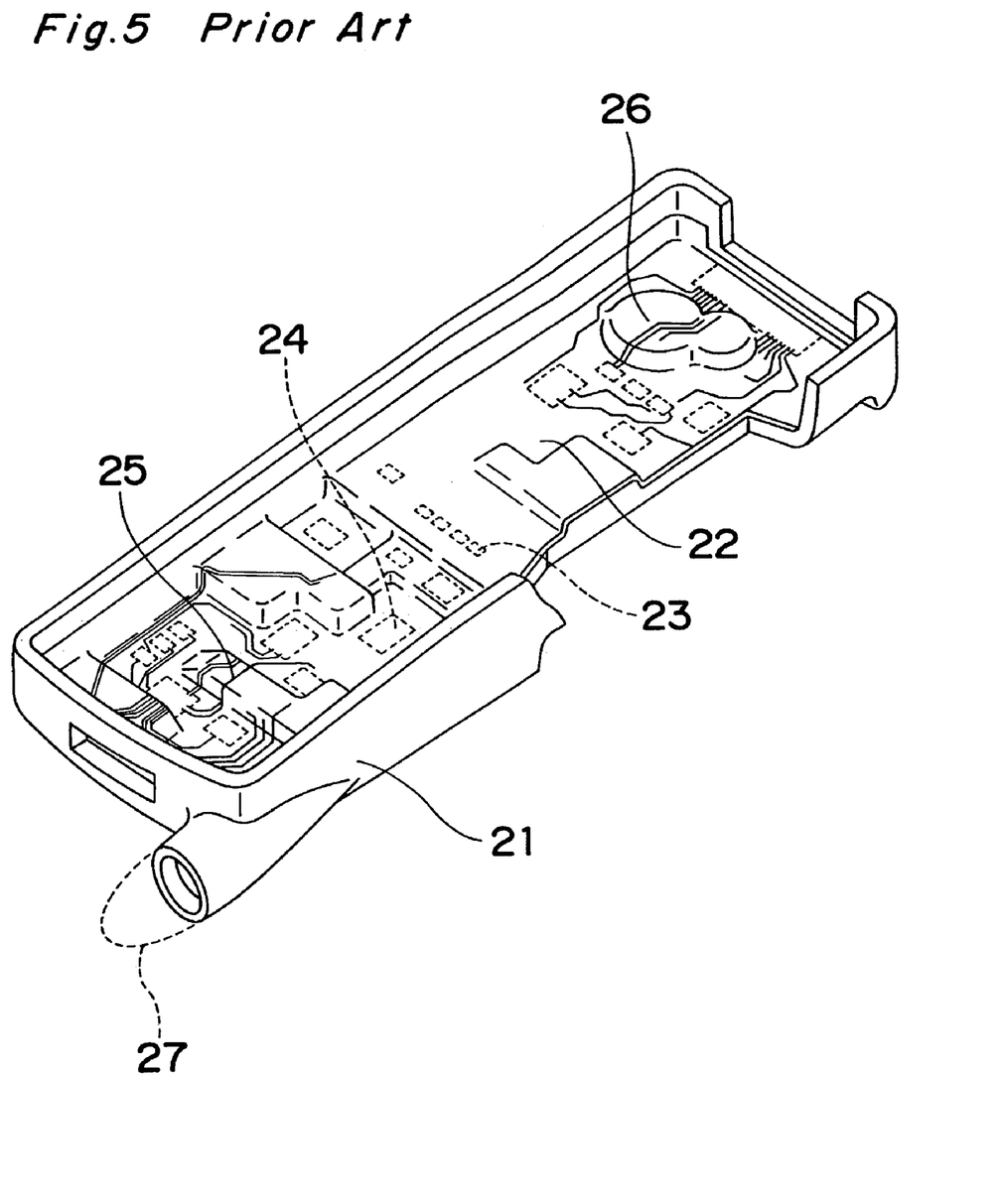
FIG. 5 is a perspective view of a part of a cellular phone.

FIG. 5 shows a part of a cellular phone. The cellular phone has a housing 21 in which a circuit board 22 or substrate is received. The circuit board 22 supports a plurality of electronic parts 23, a microprocessor (MPU) 24, a speaker 25 and a microphone 26 mounted thereon. With this cellular phone so constructed, a signal received by an antenna 27 is processed by the microprocessor 24, then transformed into an audio signal by the electronic parts 23, and finally transmitted from the speaker 25 in the form of a voice. On the other hand, voices collected at the microphone 26 are transformed into a corresponding voice signal, then processed by the electronic parts 23 and the microprocessor 24, and finally transmitted from the antenna 27.

Disadvantageously, downsizing of electronic devices requires an elevated performance of heat radiation for the circuit board. This problem may be solved by an enlargement of the circuit, which results in an enlargement of the phone. On the other hand, it is impossible to reduce an area of the circuit board to be less than that of the electronic parts. In addition, currently used circuit board 22 and electronic parts 23 are relatively large in thickness. These circumstances provide a great difficulty of downsizing the cellular phone and result in an increase of its manufacturing cost. To solve such problems, another idea may be proposed to layer a plurality of circuit boards. However, this requires longer wires for electrical connection of electronic parts, which results in a difficulty of its jitter control.

Meanwhile, a double-sided circuit board bearing circuits on opposite surfaces, and a multi-layered circuit board, have been used for compactness and high performance of a circuit substrate of electronic and optical devices. In fact, a high density, multi-layered substrate is employed in a large number of electronic devices.

In a process for manufacturing such a multi-layered substrate, a glass cloth is impregnated with epoxy resin and then dried to produce a substrate material typically called a "prepreg". Opposite surfaces of the prepreg are covered with a copper film on which a dry film is then laminated. The dry film is exposed to light and then developed to form an etching pattern with which the copper film is etched. Finally, the dry film is removed from the prepreg to result in a double-sided circuit board. Double-sided circuit boards and prepregs are layered alternately and then integrated by heating and pressing into a multi-layered circuit board. Subsequently, holes are defined in the multi-layered circuit board as necessary. Also, an electrically conductive layer is deposited on an inner surface of each hole, thereby causing electrically conductive layers mounted on the circuit board to be electrically connected to each other.

On a surface of the multi-layered circuit board so constructed, a variety of functional parts are mounted to form a specific circuit. Typically, semiconductor chips including an LCR for signal processing, and also one or more packaged logic devices for calculation, are mounted on the surface of the multi-layered circuit board. Further, in order to add other functions required for the electronic and optical devices, a plurality of multi-layered circuit boards can be connected with each other to form a certain module. Furthermore, a certain functional module and/or power circuit may be connected for transformation of an electrical, optical and/or audio signal into necessary information required for a device.

Figure 9:
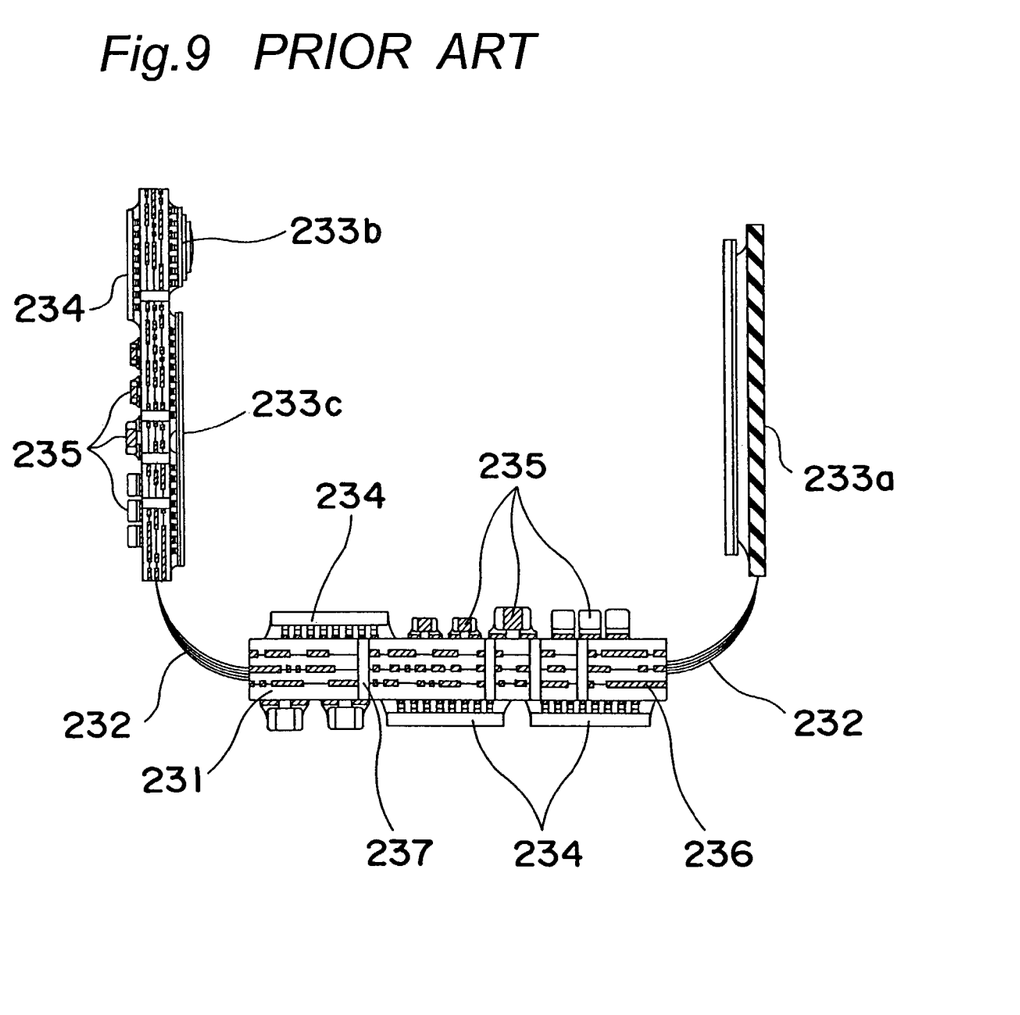
FIG. 9 is a cross sectional view of a conventional electronic and/or optical device with a multi-layer circuit substrate and functional modules.

FIG. 9 shows a conventional electronic/optical device using the multi-layered circuit board and the functional modules. As can be seen from the drawing, the device has a multi-layered printed circuit board 231, a flexible board 232, a liquid crystal module 233a, an optical camera module 233b, an input touch panel module 233c, a packaged logic circuit 234, a chip-like functional component 235, a copper wire 236 defined in the multi-layered circuit board, and through-holes 237 each filled with an electrically conductive paste for electrically connecting circuits on respective layers.

In operation of the device using the multi-layered circuit board, optical information is captured and then transformed into a corresponding electrical signal by the optical camera module 233b. This signal is processed into image data by the logic circuit 234 on a bottom surface of the board. Other information inputted through the touch panel module 233c is also transformed into a corresponding electrical signal which is then processed by chip circuit components on the bottom surface of the board, for example. This information is then transformed into respective signal data which is transmitted through the flexible board 232 to another multi-layered circuit board where it is further transformed by logic circuit 234 and functional components 235 such as LCDs. Subsequently, data so transformed is transmitted through the flexible board 232 to the liquid crystal module 233a where it is transformed into a corresponding optical signal and then displayed in the form of an image.

As described above, functional devices and components mounted on opposite surfaces of the multi-layered circuit board are electrically connected by various wires mounted within and/or between layers. Also, copper wires 236 (circuit pattern) of respective layers and an electrically conductive paste 237, filled into through-holes for connection of the copper wires 236, are electrically connected with each other to form a three-dimensional circuit.

However, in this three dimensional circuit, the functional components are mounted only on each surface of the layers. This results in various difficulties with regard to shortening of the wires between the components and/or modules, and requires a flexible circuit board, for example, for electrical connection of the layers, which may cause an adverse affect such as loss and/or noise during transmission of high frequency signals. Also, chip components and packaged functional devices are connected to the board by soldering, for example, which makes it difficult to increase a performance of an overall circuit due to possible inaccuracies of the components and their mounting. This further provides great difficulty with regard to manufacturing of a high-frequency and high-speed digital device, and accordingly, with regard to downsizing and high-functionalization of the device.

Figure 13:
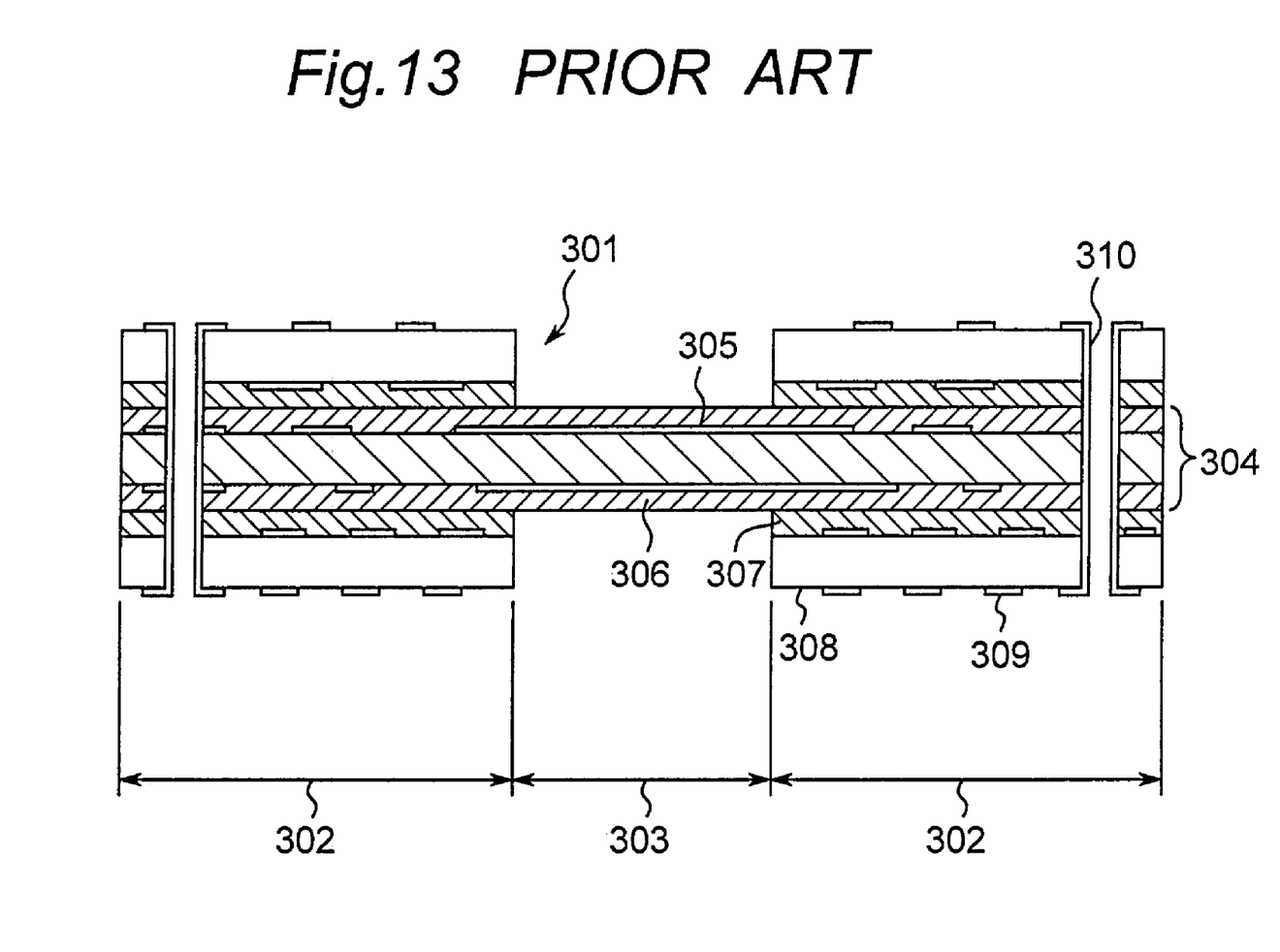
FIG. 13 is a cross sectional view of a conventional flex-rigid substrate.

FIG. 13 shows a conventional flex-rigid circuit board 301. The board 301 has an unfoldable rigid portion 302 and a foldable flexible portion 303. The flexible portion 303 supports a multi-layered circuit board 304 bearing a conductive circuit 305. The conductive circuit 305 is covered by a protective film 306 bonded thereon. In the rigid portion 302, a rigid circuit board 308 is layered on and bonded to the multi-layered circuit board 304 using a bonding sheet and/or prepreg 307. Also, in the flexible portion 303 where the multi-layered circuit board 304 is exposed, the bonding sheet and/or prepreg 307 and an associated part of the rigid circuit board 308 are removed therefrom. A plurality of electronic components 309 are mounted on the rigid circuit board 308 of the rigid portion 302. These components 309 are electrically connected by through holes 310 running through the multi-layered circuit board 304 and the rigid circuit board 308.

As described above, the conventional flex-grid circuit board 301 lacks flexibility in a region including the multi-layered circuit board 304, which results in great difficulties with regard to configuration of the circuit board, and accordingly, with regard to its installation into a housing with curved portions. Also, the multi-layered circuit board 304 has a certain thickness which prevents shortening of wires in its direction and fails to meet high-frequency requirements. Further, a number of through-holes should be arranged in a complex manner for connection of layered circuits, which provides various restrictions on a circuit design and downsizing of the circuit board, for example, and increases manufacturing costs of the circuit board.

Additionally, according to this conventional multi-layered circuit board, each layer is fully bonded to an adjacent layer. Also, only after completion of manufacturing of the circuit board, is a test performed to confirm whether each layer operates in an expected manner. This is because it can be thought that the multi-layered circuit board works well only after all the layers have been fabricated and then connected with each other. This means that no operational test could be performed until completion of manufacturing of the multi-layered circuit board, which makes it difficult to determine or remove defective products during a process of manufacturing, which results in a decrease of a yield rate and makes products costly.

SUMMARY OF THE INVENTION

According to the present invention, an electrical circuit substrate has a flexible thin film, electric wires supported on the film, and an electronic component supported on the film and positioned between the wires without any overlap with the wires so that the wires and the component are connected serially, and a thickness of the component is less than that of the electric wires.

In another aspect of the present invention, a circuit substrate has a plurality of films layered one on top of another, with each film supporting electric wires and an electronic component electrically connected between the wires, wherein wires on one film and those on another film are electrically connected to each other through a connection running between opposite surfaces of the one or another film.

In another aspect of the present invention, a circuit substrate has a plurality of layers each of which is selected from any one of a first organic film supporting a circuit with a functional module, a second organic film supporting a thinned functional circuit, and a third organic film supporting a bare chip functional device, with circuits on the layers being electrically and/or optically connected to each other.

In another aspect of the present invention, provided is a circuit substrate which is incorporated within a cellular phone, personal data assistant, computer, identification card, electric wallet, remote controller or memory card, wherein the substrate has a plurality of layers each of which is selected from any one of a first organic film supporting a circuit with a functional module, a second organic film supporting a thinned functional circuit, and a third organic film supporting a bare chip functional device, with circuits on the layers being electrically and/or optically connected to each other.

In another aspect of the present invention, a circuit substrate has a plurality of circuit modules layered one on top of another. Each of the circuit modules has two flexible circuit boards each supporting components for transmitting or processing a signal and a circuit for connecting the components, and a flexible connecting portion formed integrally with the two flexible circuit boards and supporting a circuit for electrically and/or optically connecting circuits on the circuit boards.

In another aspect of the present invention, a circuit substrate has a first circuit module and a second circuit module, with each of the first and the second circuit modules having first and second circuit boards and a connection portion for connecting the first and second circuit boards, with each of the first and second circuit boards supporting a plurality of components for transmitting or processing a signal and a circuit for connecting the components, and with the connecting portion supporting another circuit for connecting circuits on the circuit boards, wherein the first and the second circuit modules are layered so that the first and the second circuit boards of the first circuit module are layered on the first and second circuit boards of the second circuit module.

In another aspect of the present invention, a process for manufacturing a circuit substrate, with the substrate having a plurality of circuit modules layered one on top of another, and with each of the circuit modules having a flexible circuit board supporting components for transmitting or processing a signal and a circuit connecting the components, and with the substrate also having a flexible connecting portion integrated with the circuit boards for electrically and/or optically connecting the circuit boards, comprises detecting an operation of circuits supported on one or more circuit modules before a completion of layering of the circuit modules.

It should be noted that the present application is based upon three Japanese Patent Applications Nos. 2001-355415, 2002-019947 and 2002-086373, the entire contents of which are incorporated herein by reference.

DETAILED DESCRIPTION OF THE PREFERRED EMBODIMENTS

With reference to the drawings, various embodiments of the present invention will be described hereinafter. For clarity of the drawings, like parts are designated with like reference numerals throughout the drawings.

First Embodiment

Figure 1:
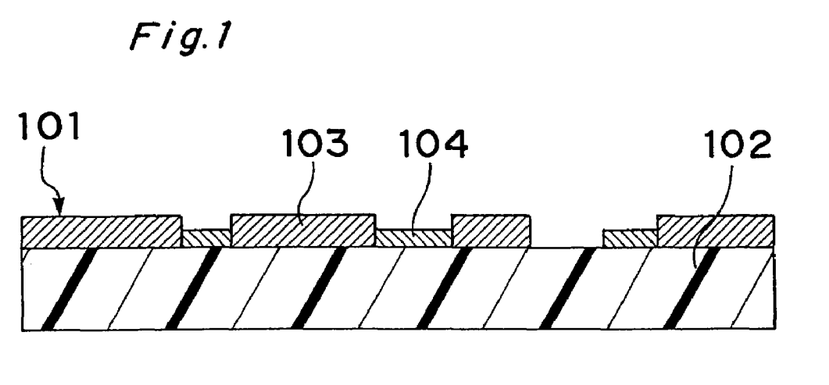
FIG. 1 is an enlarged cross sectional view of a single-layer thinned circuit substrate according to a first embodiment of the present invention.

FIG. 1 shows an enlarged thinned circuit board 101 incorporated in an electronic device such as a cellular phone. As shown in the drawing, the circuit board 101 has a base 102 made from a thinned flexile and foldable film. The base 102 has a number of thinned wires 103 formed on one or both of its major surfaces. A plurality of components 104, each having a thickness less than that of the wires 103, are also mounted on the film between the wires 103, i.e., beside the wires, so as not to overlap the wires. Preferably, the film of the base 102 is made of polyethyleneterephthalate (PET), polyimide, or polyphenylene sulfide (PPS). Also preferably, a thickness of the film is about 5–150 µm in order to provide sufficient flexibility to the film. The film may be a metal film such as aluminum foil. When using aluminum foil, an insulation layer made of epoxy resin, for example, may be provided on its surface. This insulation layer is not necessary if a surface of the film bears an oxide coating formed thereon.

The wires 103 are formed by forming a film of conductive metal on the major surface or surfaces of the base 102 by use of a known film formation technique such as physical and chemical vapor deposition, and then etching this metal film. Preferably, a thickness of the wires 103 is equal to or less than about 3 µm. Although copper having high conductivity is preferably used for the metal of the wires 103, other materials such as palladium, gold and silver may be used instead.

The components 104 include capacitors, coils, resistors and transducers, for example, each of which is manufactured on the base 102 by use of a known film formation technique such as physical and chemical vapor deposition, typically employed during manufacturing of semiconductor elements. Alternatively, thinned components already manufactured on another film may be positioned on the base 102 and then electrically connected with associated wires 103 by soldering. Preferably, in any case, a thickness of the components is less than about 1 µm.

As described above, thinned base 102 of the circuit board 101 according to this embodiment supports thinned wires 103 of elevated conductivity and thinned components 104, which are thinner than the wires 103, which provides the circuit board 101 with greater flexibility and thus allows it to follow any configuration of a housing with ease. Also, the circuit board 101 can be accommodated within a smaller space than can a conventional rigid circuit board, which allows further downsizing and weight reduction of the device. Also, when a portion of the circuit board 101 bears a component having a thick element such as speaker shown in FIG. 5, another portion of the circuit board surrounding this element is curved, allowing the circuit board with the element to be housed within a small space of the device.

Second Embodiment

Figure 2:
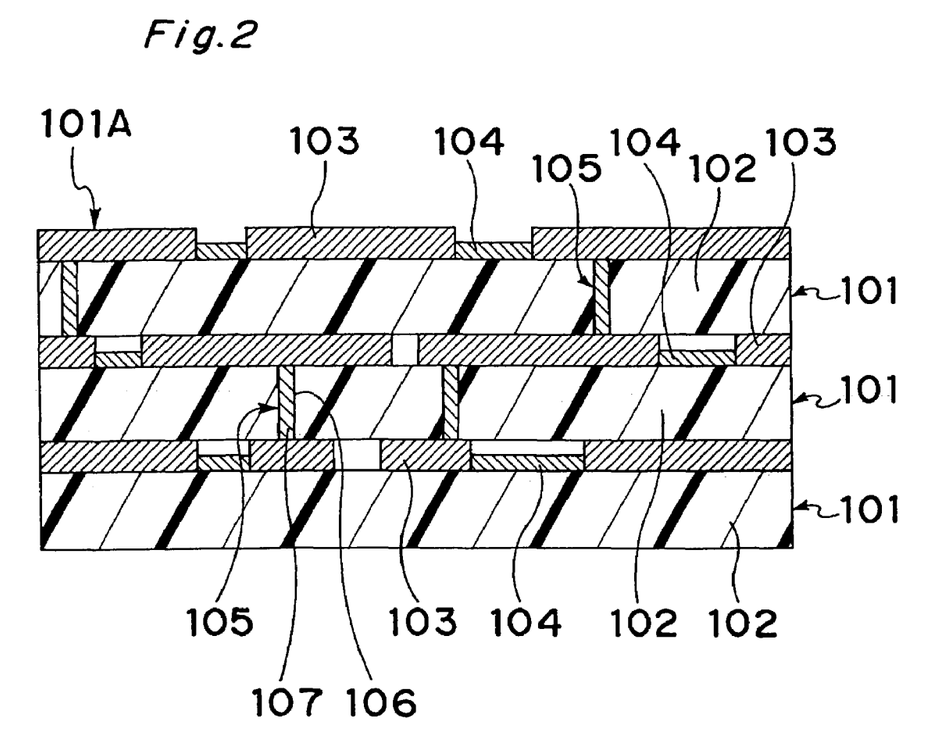
FIG. 2 is an enlarged cross sectional view of a multi-layer thinned circuit substrate according to a second embodiment of the present invention.

FIG. 2 is an enlarged cross sectional view of a thinned circuit board of a second embodiment. As shown in the drawing, a multi-layered circuit board 101A is manufactured by stacking a plurality of single-layer circuit boards 101 or layers of the first embodiment. Although the multi-layered circuit board 101A has three single-layer circuit boards in the embodiment, the number of the single-layer circuit boards is not limited thereto. Preferably, the single-layer circuit boards are connected entirely or in part to each other by use of an insulative adhesive or a suitable connector such as a clip.

Components 104 mounted on one single-layer circuit board 101 can be electrically connected with those mounted on an adjacent single-layer circuit board 101 through electrical connectors 105 defined in either of these two single-layer circuit boards 101. For example, each electrical connector 105 is defined by a wire portion 107 formed on an inner surface of a through-hole 106 extending through a single-layer circuit board, or filled in the through-hole, which may be formed by use of a known semiconductor manufacturing technique.

With this arrangement of the multi-layered circuit board 101A, for example, an electrical signal from one component 104 on a top base 102 or single-layer circuit board is transmitted through wire or wires 103 and then through the electrical connector 105 of the top base to another component 104 of a second layer 102 or single-layer circuit board. This ensures that the signal is transmitted through a shorter pass, when compared with a conventional circuit board in which a signal is transmitted through another pass mounted on an edge of or around the circuit board. This prevents the signal from picking up possible unwanted noises and/or disturbances.

As described above, the thinned circuit board 101A of the present invention, which is made of thinned base 102 and the thinned components 104 mounted thereon, minimizes the number of components to be mounted on the base 102. This causes the circuit board 101A to be downsized, allowing the circuit board 101A to be housed within a smaller space and made lighter in weight.

Third Embodiment

Figure 3:
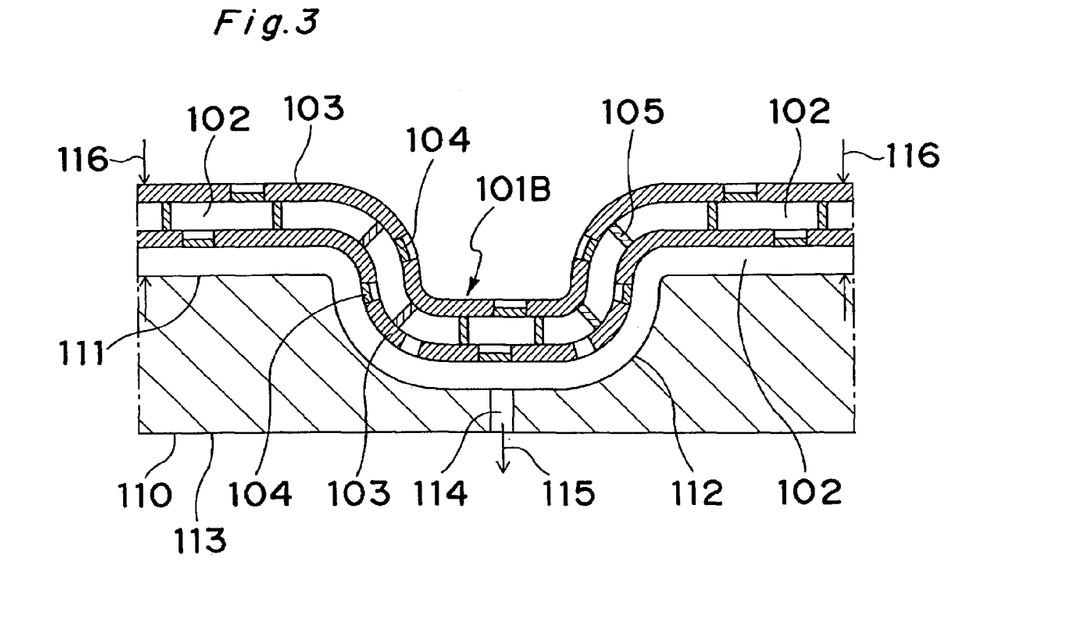
FIG. 3 is an enlarged cross sectional view of the multi-layer circuit substrate of FIG. 2 in which a part of the substrate is deformed.

FIG. 3 shows a housing 110 and a multi-layered circuit board 101B received in the housing. In this embodiment, the housing 110 has a surface 111 for receiving the circuit board.

This receiving surface 111 has a deformation such as recess 112 or curved portion where at least one hole 114 extends between top and bottom surfaces, 111 and 113, of the housing.

In order for mounting the circuit board 101B in the recess 112 as illustrated, first a plate like circuit board 101B is placed on the surface 111 of the housing 110 so that it covers the recess 112. Then, a chamber defined within the recess 112 is connected to and then vacuumed by a suitable vacuum machine 115, so that flexible thinned circuit board 101B is deformed by the vacuum pressure in the chamber to follow an inner configuration of the recess 112, thereby providing the circuit board 101B with a three dimensional configuration corresponding to that of the recess 112.

If the circuit board 101B can easily recover to its original plane configuration due to its elasticity by elimination of the vacuum, a peripheral edge of the circuit board 101B is preferably fixed continuously to the housing 10 by use of a suitable bonding technique such as heat sealing 116 and use of adhesive. In this instance, the hole 114 is closed by heating and then deforming a housing portion surrounding and defining the hole, or by filling a suitable bonding material into the hole, which permanently maintains the three dimensional deformed configuration of the circuit board. If an overall surface of the circuit board, or at least a portion of the circuit board adjacent to the chamber of the housing 10, is smooth and does not support any component, no heat seal is needed. Also, if the circuit board 101B is deformed plastically beyond its elasticity limit, nothing is required for retaining this deformed condition. Further, the circuit board 101B may be deformed to a configuration corresponding to that of the chamber before it is mounted in the housing.

As described above, the thinned circuit board is housed within the housing without any difficulty even when the housing has a convex and/or concave portion. This ensures that the housing, or device receiving the housing, is designed freely and also decreases manufacturing time and cost. Also, performance of the device is improved.

Although the circuit board 101B is deformed by use of a vacuum, such deformation can be performed by a heat press in which the circuit board is heated and then deformed.

Fourth Embodiment

Figure 4:
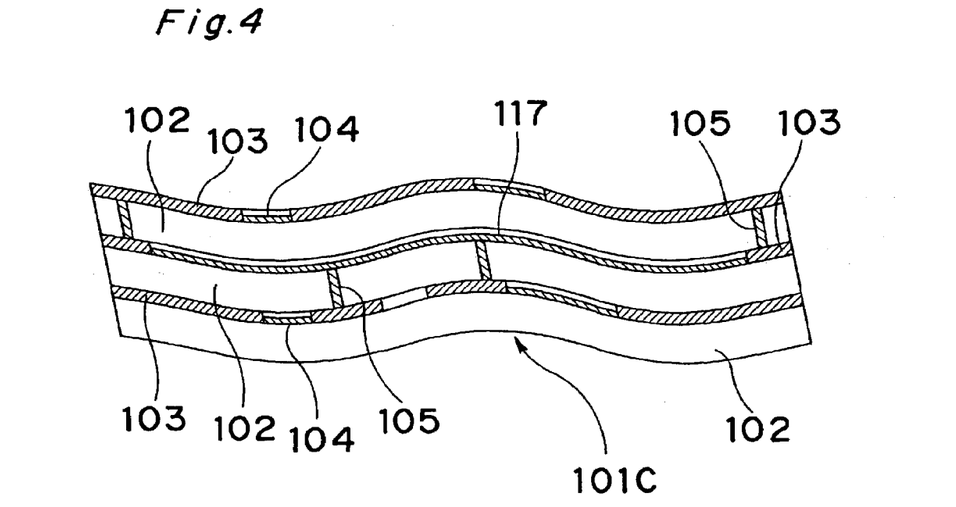
FIG. 4 is an enlarged cross sectional view of a multi-layer circuit substrate according to a fourth embodiment of the present invention, in which a piezoelectric element is incorporated.

FIG. 4 shows another thinned circuit board 101C according to a third embodiment of the present invention. The circuit board 101C is featured in that a piezoelectric element 117 is incorporated into the circuit board so that the piezoelectric element detects a deformation of the circuit board and then generates a signal corresponding to an amount of the deformation. The piezoelectric element 117 is formed on base 102 before or after formation of wires 103 on the base 102, by use of a known film formation technique such as physical and chemical vapor deposition typically employed during manufacturing of semiconductor elements. Also, a single-layer circuit board in which the piezoelectric element 117 has been formed is stacked on another single-layer circuit board, each bearing required wires 103, components 104 and connectors 105, and then bonded thereto, if necessary, to obtain the thinned circuit board 101C.

In operation of the circuit board 101C so constructed, if the base is deformed by any external force or energy, the piezoelectric element 117 follows this deformation. In the piezoelectric element, deformation is changed into a signal having a voltage corresponding to an amount of deformation, which is transmitted from an associated wire. If the force or energy is eliminated, the base returns to its original state and an output voltage of the piezoelectric element 117 returns to that before the deformation.

Therefore, the piezoelectric element 117 can be used as an audio component of a speaker and microphone. This means that the speaker and microphone can be downsized. On the other hand, the piezoelectric element 117 can be used as a vibration generator or vibrator. In this instance, the piezoelectric element may be located on opposite sides of an axis so that it expands and contracts and thereby rotates about the axis in response to on/off operation of voltage, so as to minimize a difference between actual deformation and calculated deformation derived from a deformation versus voltage relationship.

Although deformation of the circuit board is detected by the piezoelectric element 117, the piezoelectric element may be replaced by a spring switch, for example.

Fifth Embodiment

A fifth embodiment relates to another thinned circuit board, i.e., an integrated circuit structure made of film-like devices. This thinned circuit board has film layers each being one of three organic films, i.e. a first organic film supporting a circuit with at least one functional module, a second organic film supporting a thinned functional circuit, and a third organic film supporting a circuit with functional devices like bare chips, in which the circuits on the films are electrically and/or optically connected to each other.

Figure 6:
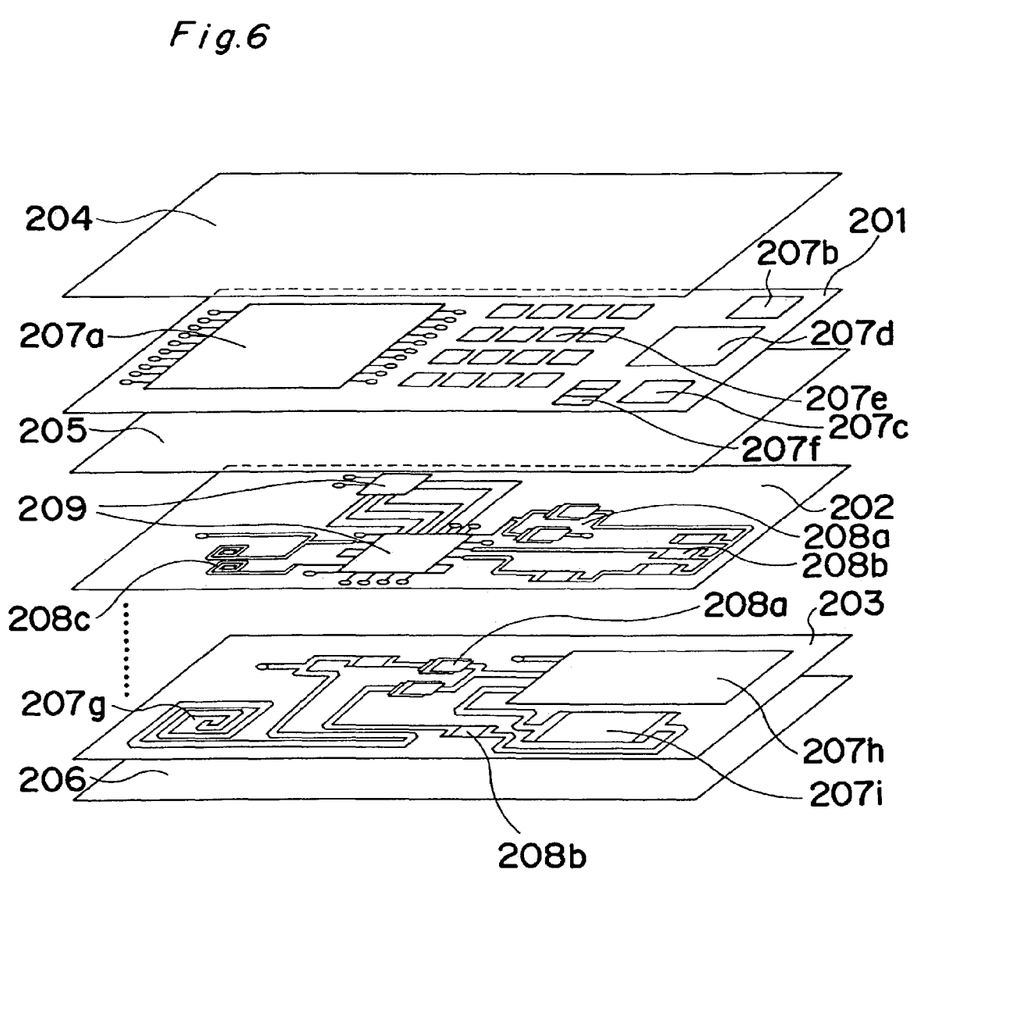
FIG. 6 is an exploded perspective view of a thinned circuit substrate according to a fifth embodiment of the present invention.
Figure 7:
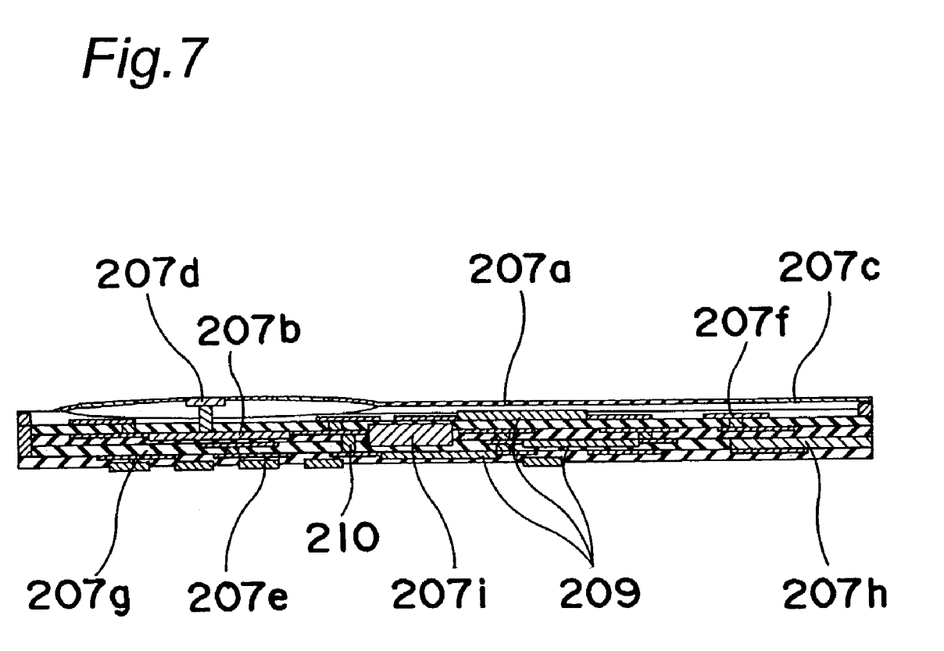
FIG. 7 is a cross sectional view of the thinned circuit substrate of FIG. 6.
Figures 8A, 8C:
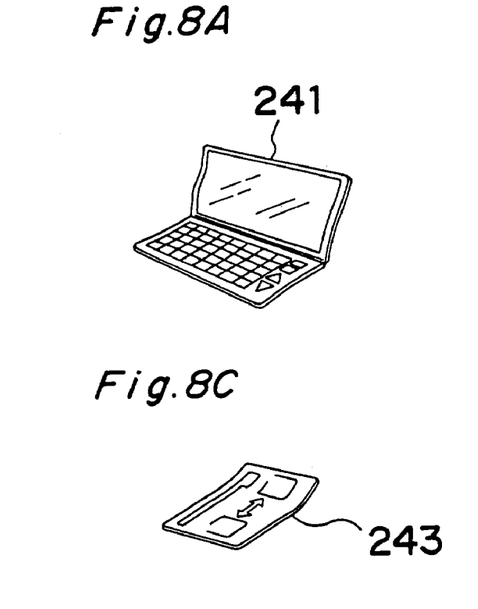
FIGS. 8A to 8F show specific embodiments of a multi-layer film device.
Figure 8B:
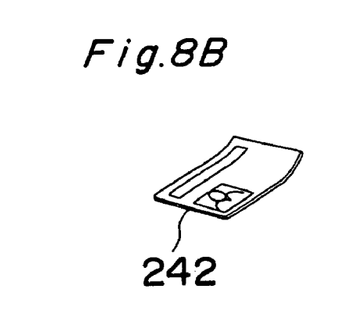
Figures 8D, 8F:
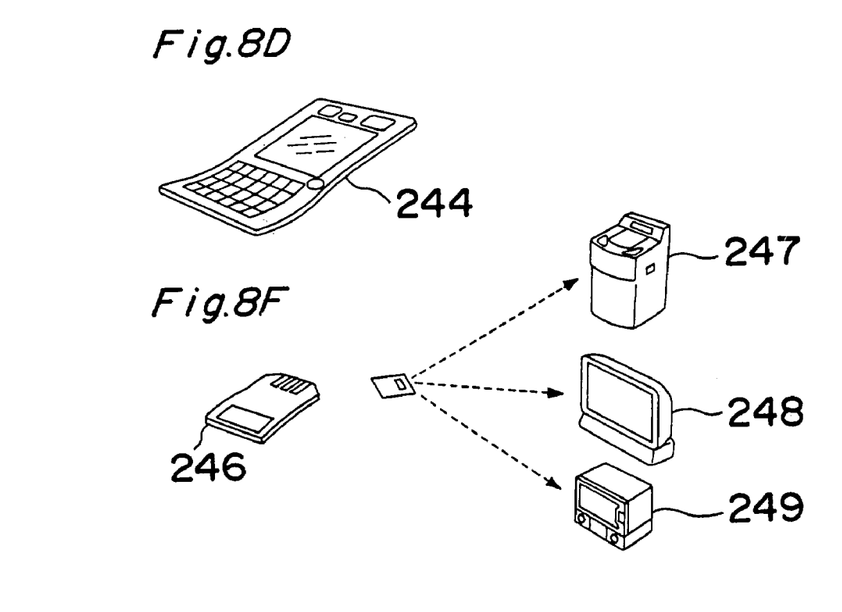
Figure 8E:
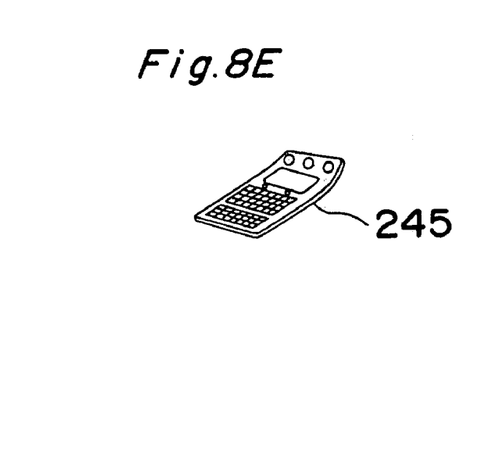

Referring to FIGS. 6 and 7, the circuit board has a plurality of films positioned one on top of another. The films include an organic film 201 supporting functional modular circuits, an organic film 202 supporting thinned functional components and bare-chip devices, an organic film 203 supporting functional modular circuits and thinned functional circuits, a transparent protective film 204, a bonding film 205 and a protective film 206. In the drawings, thinned functional modules, the functional circuit components and bare-chip functional devices are indicated by reference numerals 207a–207i, 208a–208c and 209, respectively. Also, metal connections for electrically connecting circuits on different films are indicated by reference numeral 210.

The functional modules may include a liquid crystal display 207a, a receiver (or speaker) 207b made of piezoelectric material, a thinned microphone 207c, a CCD camera 207d, a button 207e such as a touch panel, a light emitter 207f such as an LED, a thinned antenna 207g for receiving a signal, a thinned battery 207h and a thinned vibrator 207i for generating vibrations.

In FIG. 6, the functional modules 207a–207i are positioned on the organic films 201 and 203 made of PET or polyimide and having a thickness of about 100 µm. Also, the organic film 201 supports modules having an audio-visual interface for operators, on top of which the protective film 204 is bonded. The components mounted on the organic film 201 transform electrical and optical signals into corresponding audio signals and vice versa. Also, circuits connected between various functional modules process necessary information.

The organic film 203 supports various functional modules for supplying power to mobile terminals, receiving signals and generating vibrations, irrelevant to audio-visual operation of human beings. A bottom surface of the organic film 203 is covered by the protective film 206.

As shown in FIG. 7, in order to process and control signals to and from the functional modules 207a–207i, the organic films are electrically connected by metal connections 210 such as metal bumps. Other portions, except metal connections 210, are electrically disconnected from each other. Also, in order to connect the organic films, an organic material such as bonding film 205 is provided therebetween.

Each of the organic films 201, 202 and 203 may be made of a plurality of stacked films. In this instance, the bonding film 205 may be placed between the stacked films.

For an optical connection between layers, a transparent film may be provided entirely or partially between the layers so that light emitted from a light emitter such as an LED is received by a light receiver such as a photo-diode.

The organic film 202 supports various functional circuits such as a functional component or device for processing and controlling various signals. The functional circuits include a thinned capacitor 208a, a thinned register 208b and thinned inductor 208c. These functional circuits may be manufactured on the organic film 202 by a suitable film formation technique such as sputtering. Alternatively, these thinned functional components may be prepared on another organic film, which are then separated from each other.

The functional circuits are manufactured by forming one or more layers, each having a thickness of less than 10 μm, by use of a known film formation technique and then patterning the layers. If this manufacturing requires a film formation process in which a circuit is exposed to an elevated temperature, a heat resisting material such as polyimide is preferably used for the organic film 202. The functional devices 209 may be bare chips including semiconductors made of silicon and/or other chemical compounds. For example, the devices 209 are an IC and an LSI capable of electrically performing a calculation, or semiconductor devices made of GaAs and/or other chemical compounds and capable of functioning as optical circuits. These bare chips, functional devices 209, are mounted on wires formed on the organic film 202 through metal connections such as bumps. For example, each device 209 has a thickness equal to or less than about 100 μm.

Using the circuits described above, constructed is a thinned mobile terminal device, i.e., a circuit structure shown in FIG. 7. As described above, since multi-layered bases are made of thin and light film, the structure has a minimum thickness, equal to or less than about 7 μm, for example, and a minimum weight.

Although the structure of the film-like integrated circuit is applied to a mobile device (i.e., thinned cellular phone), it can be embodied as other thinned devices because of its minimum thickness of about equal to or less than 7 μm. As shown in FIGS. 8A to 8F, examples of thinned devices are a sheet-like computer 241, an identification such as an ID card 242, an electronic wallet 243, a personal data assistant (PDA) 244, a remote controller 245 and a memory card 246 for use with an electrical device such as electric washer 247, television 248 and microwave oven 249.

Functions provided by this structure are not limited to those for mobile devices, but may be those required for a sheet type computer, sheet ID such as a passport, license and name card, sheet memory for recording audio and visual data, sheet wallet such as credit card and season ticket and sheet-like remote controller.

As described above, according to the film-like integrated circuit structure, since the electronic components and functional circuits are electrically connected through three dimensionally arranged electric wires, i.e., connections defined in layers and wires formed on the layers, a length of the wires running between the functional components and modules can be minimized.

Also, a conventional flexible board for providing connection between a multi-layered circuit board can be eliminated. Additionally, the film base is light as compared with a conventional multi-layered circuit board made of epoxy with glass fibers. Thus, the circuit board is light in weight.

Further, a metal connection such as bumps can be used for connection between layers and between bare-chip devices and associated circuits, which reduces a deterioration of high-frequency signals to a certain extent when compared with a conventional connection using conductive paste material, and thereby decreases a signal transmission loss.

Furthermore, since the multi-layered device employs an optical connection for signal transmission between layers, an optical signal from an optical device can be used as optical information, which considerably reduces an adverse affect caused by noises and allows a high speed and mass signal processing.

Moreover, functional circuits and bare-chip functional devices made of thin films, each having a thickness less than 10 μm, are incorporated between the layers. Then, when compared to a circuit structure using chip components or package devices, a possible inaccuracy due to mounting of those devices is eliminated, which improves performance of an overall circuit.

Therefore, the present invention provides a compact multi-layer circuit device in which operational signal frequency can further be increased and a signal can be transmitted at a high speed.

Sixth Embodiment

Figure 10A:
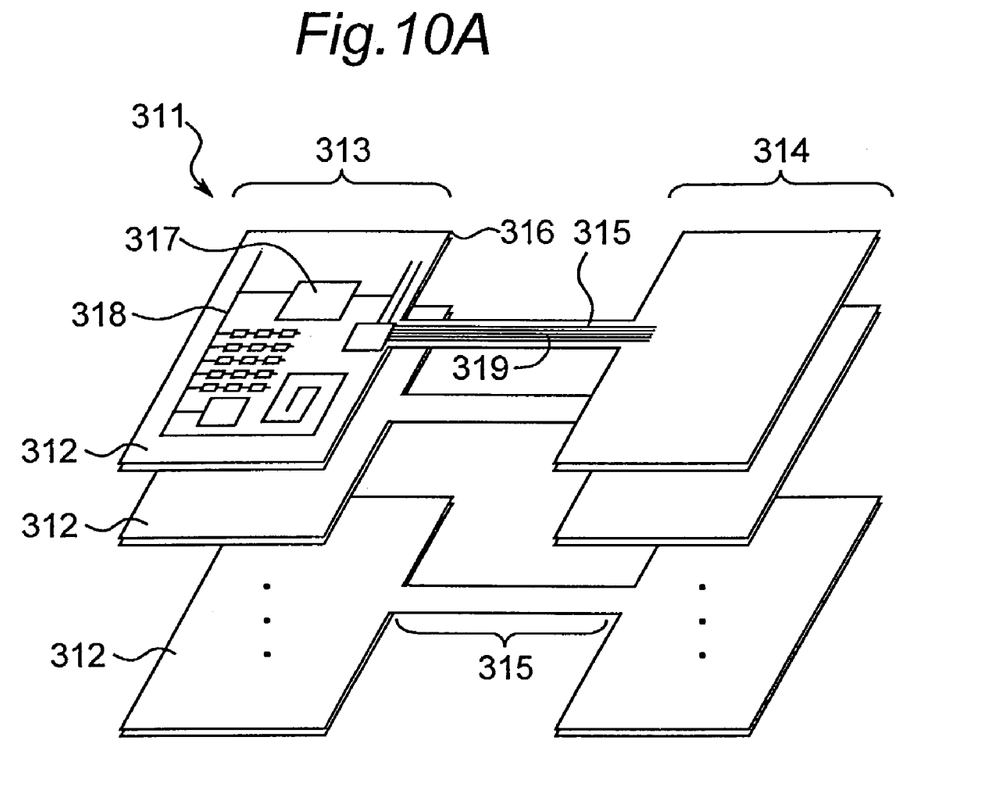
FIG. 10A is an exploded perspective view of a thinned circuit substrate according to a sixth embodiment of the present invention.

FIG. 10A also shows a thinned multi-layer circuit device according to a sixth embodiment of the present invention. As shown in the drawing, thinned multi-layer circuit 311 has a plurality of circuit modules 312, i.e., layers, superposed with one another. Each circuit module 312 has first and second rectangular circuit boards, 313 and 314, and a strip-like connecting portion 315 connecting the first and second circuit boards. A base layer 316 defining the circuit module 312 is made from a flexible thin sheet made of insulative material. For example, the sheet is made from a flexible resin film or a metal film coated with an insulative material. The sheet is cut and configured so that it outlines both the first and second circuit boards 313 and 314 and the connecting portion 315. The circuit boards 313 and 314 support necessary electronic and/or optical components 317 such as resistors, capacitors, coils and LSIs. As required, the components 317 are electrically connected to each other through wires 318 made of metal film and defined on one or opposite surfaces of the circuit boards 313 and 314. The connecting portion 315, on the other hand, supports connecting wires 319 for electrically and optically connecting the components 317 and wires 318 on the first and second circuit boards 313 and 314, as required. Other electrical and/or optical connections including through-holes (not shown) are formed in the circuit boards 313 and 314 and the connecting portion 315 for connecting wires 318 in one layer and wires 318 in other layers.

In this embodiment, base layers 316 of the circuit modules 312 have the same configuration so that, once the modules 312 are superposed, the first and second circuit boards 313 and 314 and the connecting portion 315 of one circuit module 312 are correctly aligned on those of an adjacent circuit module 312. The electronic components 317 and wires 318 and 319 on one circuit module 312 need not be identical to those on other circuit modules. Typically, each circuit module 312 bears components and wires different from those of other modules.

Figure 10B:
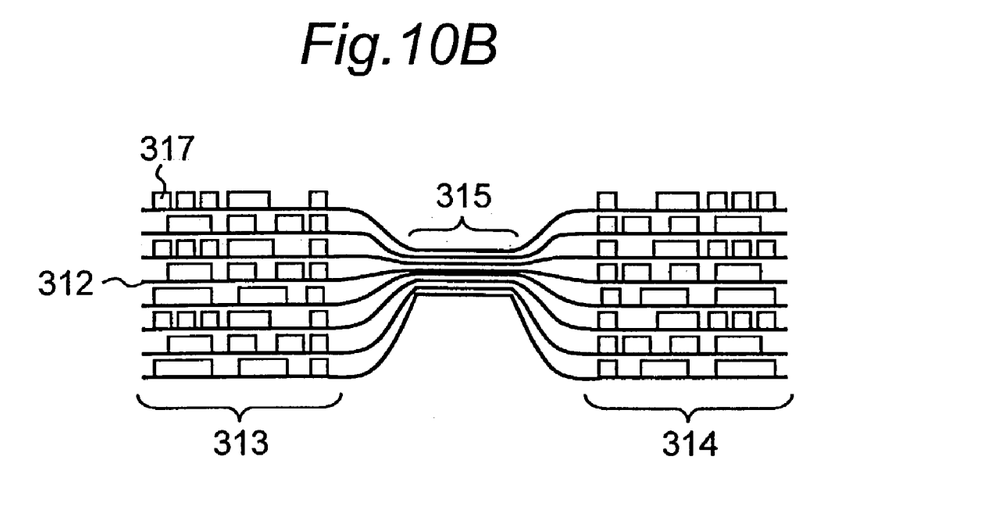
FIG. 10B is a cross sectional view of the thinned circuit substrate according to the sixth embodiment of the present invention.

As shown in FIG. 10B, the circuit modules 312 so formed are superposed so that the first and second circuit boards 313 and 314 and the connection portion 315 of one circuit module 312 are positioned on those of other circuit modules 312. Also, the superposed circuit connections 315 are then pressed and integrated, which results in the thinned multi-layer circuit 311. If necessary, a suitable adhesive is used for bonding at least respective parts of the superposed circuit boards and/or connecting portions. Preferably, a bonded area of each circuit board is equal to or less than 50% of a total area of the circuit board for effective heat radiation from an interference between the superposed circuit boards, and also for retaining a good flexibility of the multi-layer circuit.

The electric wires 318 and 319 of each circuit module 312 are electrically connected with associated wires of other circuit modules through electrical connections or through holes defined in the circuit boards 313 and 314 and/or the connecting portions 315. This means that the superposed circuit boards 313 and 314 are electrically connected only through such connections, thereby allowing heat generated in the circuit boards 313 and 314 of the circuit modules 312 to be discharged into an atmosphere through possible small gaps between unconnected portions of the circuit boards.

As described above, the integrated thinned multi-layer circuit 311 still has significant flexibility so that it can be bent or curved easily, thereby allowing the circuit to be accommodated within a housing with any configuration having convex and/or concave portions.

Seventh Embodiment

Figure 11A:
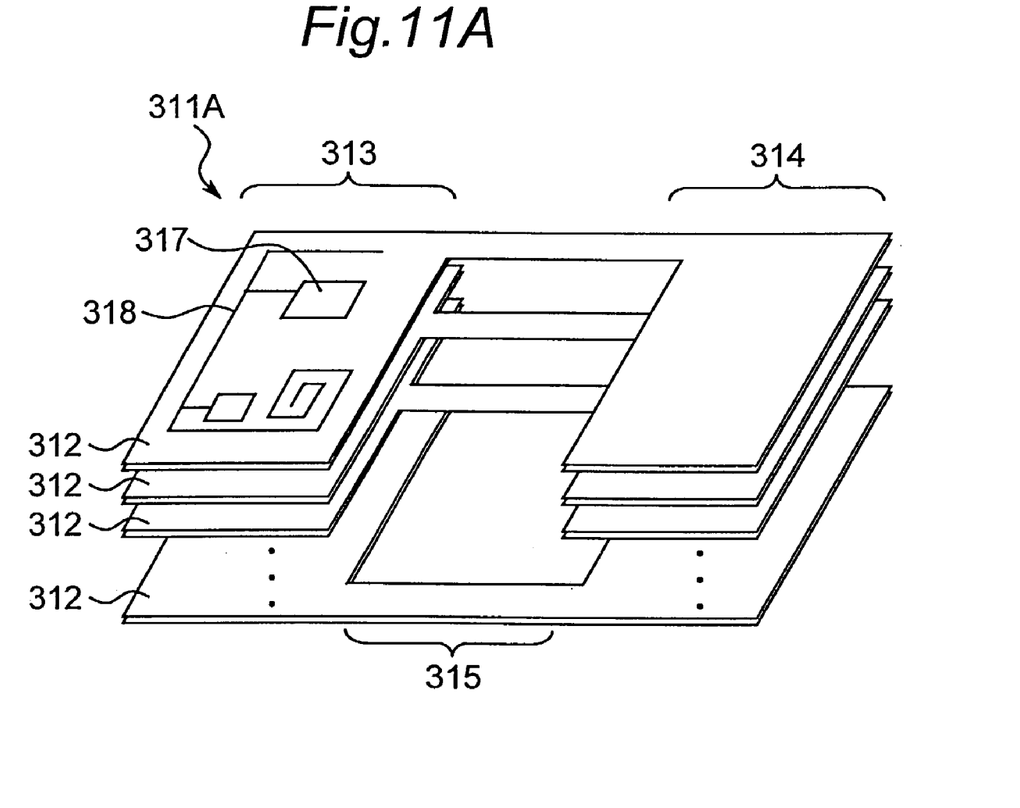
FIG. 11A is a cross sectional view of a thinned circuit substrate according to a seventh embodiment of the present invention.
Figure 11B:
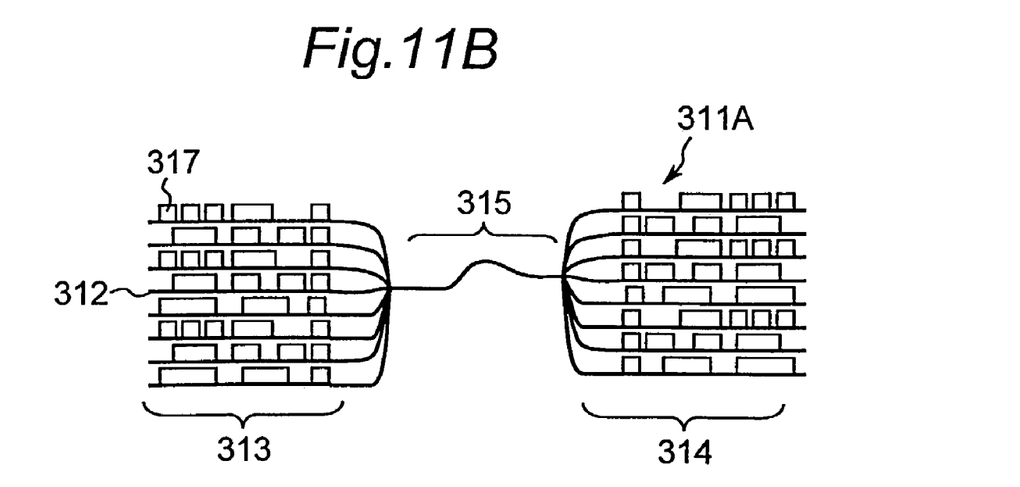
FIG. 11B is a cross sectional view of the thinned circuit substrate according to the seventh embodiment of the present invention.

FIG. 11A shows another thinned multi-layer circuit device 311A according to a seventh embodiment of the present invention. As shown in the drawing, the multi-layer circuit device 311A of this embodiment is different from that of sixth embodiment in that connecting portion 315 of one circuit module 312 takes a specific position relative to its circuit boards 313 and 314, so that, when circuit modules 312 are superposed, the connecting portion 315 of the one module takes a different position from those of other modules.

Therefore, as can be understood when comparing the multi-layer circuits shown in FIGS. 11A and 10A, although the connecting portions 315 of the multi-layer circuit 311A occupies a larger area than that of the previous embodiment, a thickness of the connecting portions in the multi-layer circuit is far smaller than that of the previous embodiment. For example, if the connecting portions are arranged so that they have no overlap with each other, the thickness of the connecting portions in the multi-layer circuit board corresponds substantially to that of a single connecting portion. This results in significant flexibility of the multi-layer circuit board, thereby allowing the circuit board to be designed more freely.

Eighth Embodiment

Figure 12:
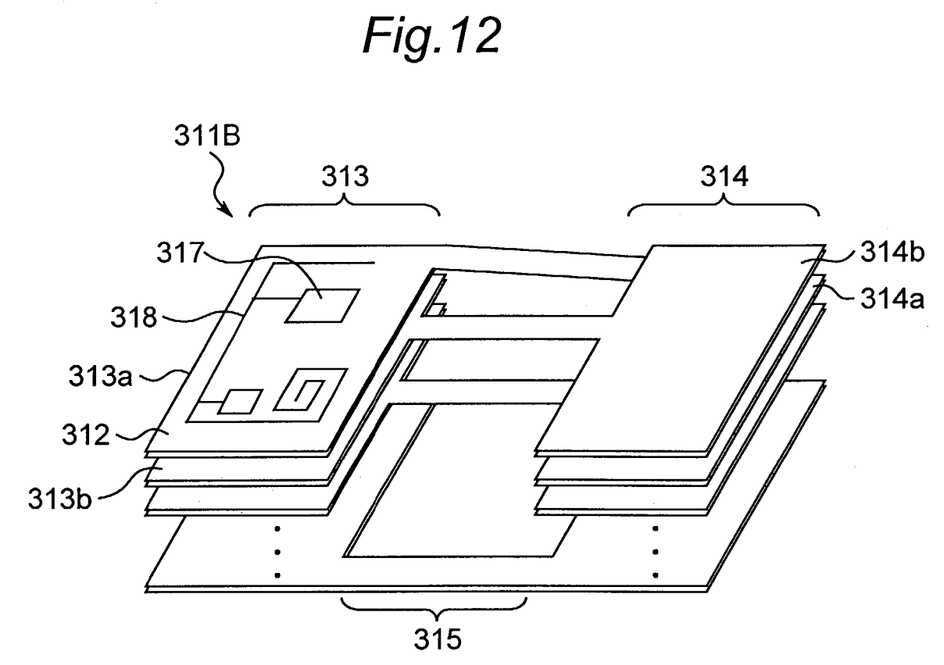
FIG. 12 is an exploded perspective view of a thinned circuit substrate according to an eighth embodiment of the present invention.

FIG. 12 shows a thinned multi-layer circuit board 311B according to an eighth embodiment of the present invention. Although the multi-layered circuit board 311B has a plurality of circuit modules 312 layered one on top of another like the seventh embodiment, it is different from that embodiment in a layering order of the circuit boards. Specifically, on the left part of the multi-layered circuit, indicated on the left side of FIG. 12, positioned in a top layer is a circuit board 313a of one circuit module 312, and in a second layer is a circuit board 313b. On the other hand, on the right part of the multi-layer circuit board, indicated on the right side of FIG. 12, circuit board 314a is positioned in the second layer and circuit board 314b is in the top layer. That is, a layering order of the circuit boards is different on the left and right sides. For clarity, only one example is shown in the drawing in which the top two layers of the circuit boards 313 and 314 are exchanged; however, a layering order of the circuit boards can be modified freely.

What is claimed is:

1. A circuit substrate, comprising:
    a flexible thin film made from polyethyleneterephthalate, polyimide or polyphenylene sulfide and having a thickness of from about 5 μm to about 150 μm;
    electric wires supported on said flexible thin film; and
    an electronic component supported on said flexible thin film so as to be positioned between said electric wires such that said electric wires and said electronic component are interconnected,
    wherein a thickness of said electronic component is less than a thickness of said electric wires.

2. The circuit substrate according to claim 1, further comprising:
    another flexible thin film made from polyethyleneterephthalate, polyimide or polyphenylene sulfide and having a thickness of from about 5 μm to about 150 μm;
    additional electric wires supported on said another flexible thin film; and
    another electronic component supported on said another flexible thin film so as to be positioned between said additional electric wires such that said additional electric wires and said another electronic component are interconnected,
    wherein a thickness of said another electronic component is less than a thickness of said additional electric wires,
    wherein a combination of said flexible thin film, said electronic component and said electric wires defines a first layer of the circuit substrate, and
    wherein a combination of said another flexible thin film, said another electronic component and said additional electric wires defines a second layer of the circuit substrate.

3. The circuit substrate according to claim 1, wherein a thickness of said electric wires and a thickness of said electronic component are less than a thickness of said flexible thin film.

4. The circuit substrate according to claim 1, wherein said flexible thin film comprises resin or metal.

5. A circuit substrate, comprising:
   films, made from polyethyleneterephthalate, polyimide or polyphenylene sulfide and each having a thickness of from about 5 μm to about 150 μm, layered one on top of another, each of said films supporting electric wires and an electronic component electrically connected between said electric wires,
   wherein the electric wires on one of said films and the electric wires on another of said films are electrically connected to each other via a connection extending between opposite surfaces of said one or said another of said films.

6. The circuit substrate according to claim 1, wherein said flexible thin film is capable of being deformed so that the circuit substrate has a three dimensional configuration.

7. The circuit substrate according to claim 6, further comprising:
   an element capable of transmitting a signal corresponding to an amount of deformation of said flexible thin film.

8. The circuit substrate according to claim 1, wherein said electric wires are made by performing a film formation technique.

9. The circuit substrate according to claim 5, wherein said electric wires are made by performing a film formation technique.

* * * * *

UNITED STATES PATENT AND TRADEMARK OFFICE
CERTIFICATE OF CORRECTION

| | |
|---|---|
| PATENT NO. | : 7,084,512 B2 |
| APPLICATION NO. | : 10/300028 |
| DATED | : August 1, 2006 |
| INVENTOR(S) | : Takaaki Higashida et al. |

It is certified that error appears in the above-identified patent and that said Letters Patent is hereby corrected as shown below:

ON THE FRONT PAGE
Under Inventors, in section (75), line 4, change "Okasa" to --Osaka--.

Signed and Sealed this

Twenty-seventh Day of February, 2007

JON W. DUDAS
*Director of the United States Patent and Trademark Office*